(12) United States Patent
Herr

(10) Patent No.: US 6,518,786 B2
(45) Date of Patent: Feb. 11, 2003

(54) COMBINATIONAL LOGIC USING ASYNCHRONOUS SINGLE-FLUX QUANTUM GATES

(75) Inventor: Quentin P. Herr, Torrance, CA (US)

(73) Assignee: TRW Inc., Redondo Beach, CA (US)

( * ) Notice: Subject to any disclaimer, the term of this patent is extended or adjusted under 35 U.S.C. 154(b) by 0 days.

(21) Appl. No.: 09/882,885

(22) Filed: Jun. 15, 2001

(65) Prior Publication Data

US 2003/0011398 A1 Jan. 16, 2003

(51) Int. Cl.[7] ............................................. H03K 19/195
(52) U.S. Cl. ................................................ 326/3; 326/6
(58) Field of Search .......................................... 326/1–7

(56) References Cited

U.S. PATENT DOCUMENTS

| | | |
|---|---|---|
| 4,092,553 A | 5/1978 | Fang et al. |
| 4,097,765 A | 6/1978 | Zappe |
| 4,371,796 A | 2/1983 | Takada |
| 4,501,975 A | 2/1985 | Josephs et al. |
| 4,672,244 A | 6/1987 | Harada et al. |
| 5,051,627 A | 9/1991 | Schneier et al. |
| 5,233,244 A | 8/1993 | Suzuki |
| 5,598,105 A | 1/1997 | Kurosawa et al. |
| 6,188,236 B1 * | 2/2001 | Wikborg .................... 326/3 |
| 6,242,939 B1 * | 6/2001 | Nagasawa et al. ............ 326/3 |

OTHER PUBLICATIONS

Likharev, et al. "RSFQ Logic/Memory Family: A New Josephson–Junction Technology for Sub–Terahertz–Clock–Frequency Digital Systems," *IEEE Transactions on Applied Superconductivity*, vol. 1, No. 1, pp. 3–28, Mar. 1991.

* cited by examiner

*Primary Examiner*—Don Phu Le
(74) *Attorney, Agent, or Firm*—Katten Muchin Zavis Rosenman

(57) ABSTRACT

An asynchronous SFQ logic cell that is amenable to being used in combinational logic circuits. Rather than encode each digital logic bit as one SFQ pulse, each logic bit is encoded as a series of SFQ pulses. As such, merge and join circuits can be used for elementary logic cells to form asynchronous combinational logic circuits in accordance with the present invention. Such circuits are relatively faster and denser as well as more compatible with existing synchronous SFQ logic circuits.

12 Claims, 6 Drawing Sheets

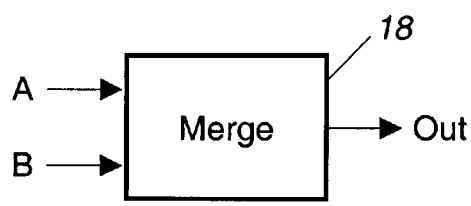
FIG. 2A
Prior Art
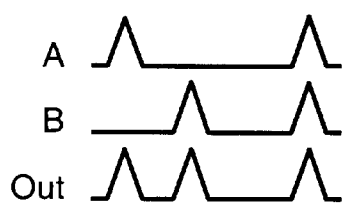
FIG. 2B
Prior Art
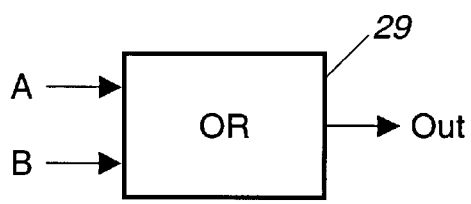
FIG. 3A
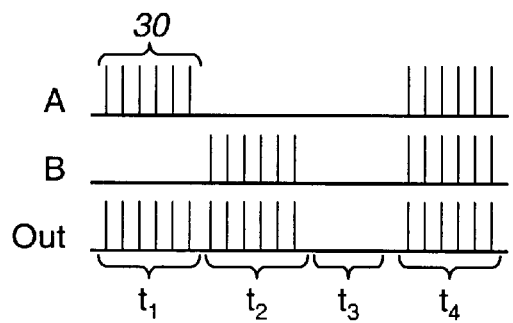
FIG. 3B
| A | 1 | 0 | 0 | 1 |
|---|---|---|---|---|
| B | 0 | 1 | 0 | 1 |
| Out | 1 | 1 | 0 | 1 |
FIG. 3C

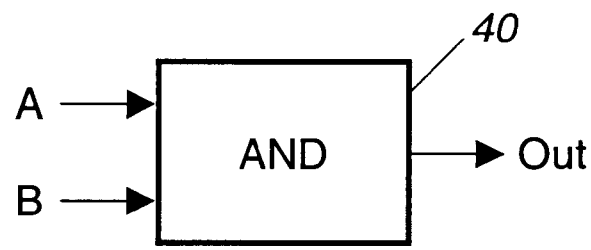
FIG. 5A
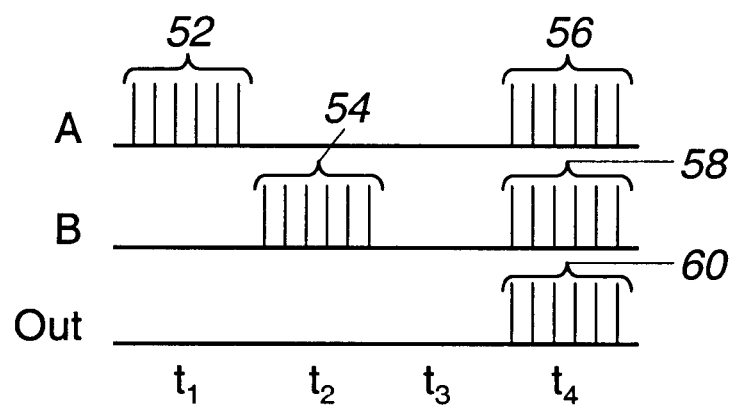
FIG. 5B
| A   | 1 | 0 | 0 | 1 |
| --- | - | - | - | - |
| B   | 0 | 1 | 0 | 1 |
| Out | 0 | 0 | 0 | 1 |
FIG. 5C

US 6,518,786 B2

COMBINATIONAL LOGIC USING ASYNCHRONOUS SINGLE-FLUX QUANTUM GATES

CROSS-REFERENCE TO RELATED APPLICATIONS

This application is related to the following commonly-owned co-pending patent applications: "Self Clocked Complementary Logic" by Herr et al., application Ser. No. 09/353,726, filed on Jul. 14, 1999 and "Superconductive Logic Gate and Random Access Memory" by Herr, application Ser. No. 09/196,791, filed on Nov. 20, 1998.

BACKGROUND OF THE INVENTION

1. Field of the Invention

The present invention relates to superconducting logic circuits and more particularly to superconducting logic circuits formed from asynchronous SFQ logic gates suitable for use in combinational logic circuits.

2. Description of the Prior Art

Superconducting logic circuits utilizing so-called Josephson junctions are known in the art. Examples of such circuits are disclosed in U.S. Pat. Nos. 4,092,553; 4,097,765; 4,371,796; 4,501,975; 4,672,244; 5,051,627 and 5,233,244. Such superconducting logic circuits are also disclosed in "RSFQ Logic/Memory Family: A New Josephson-Junction Technology for Sub-Terahertz-Clock-Frequency Digital Systems" by Likharev et al., *IEEE Transactions on Applied Superconductivity*, Vol. 1, No. 1, pp 3–28, March 1991.

Such superconducting logic circuits are known to include one or more Josephson junctions. At cryogenic temperatures, such Josephson junctions exhibit non-linear characteristics which are suitable for logic circuits. More particularly, when cooled, such Josephson junctions exhibit zero resistance when subjected to biasing currents less than the critical current $I_c$. When an electrical current greater than the critical current is applied to the input of a Josephson device, the Josephson junction switches to a finite impedance state. Normally, such Josephson junctions are biased to a current value $I_b$, just less than the critical current value $I_c$. As such, relatively small signal currents can be used to change the state of the junction. Unfortunately, such Josephson junctions are known to exhibit latching characteristics. More specifically, due to the hysteretic chracteristic of a Josephson junction, simply removing the input current does not change the state of the device. In order to unlatch the device, it is also necessary to remove the biasing current. As discussed in "RFQ Logic/Memory Family: A New Josephson-Junction Technology for Sub-Terahertz-Clock Frequency Digital Systems," supra, such latching characteristics limit the bandwidth of such logic circuits.

In order to overcome this problem, digital logic circuits have been developed which rely on the response of Josephson junctions to a short voltage pulse, rather than the resistive characteristics. When such Josephson junctions are biased by a biasing current $I_b$, less than the critical current $I_c$, a short voltage pulse V(t) induces a change in the phase of magnetic flux which generates a so-called single flux quantum (SFQ) pulse at the junction. Rather than using the change in resistive state for coding binary information, the newer circuits utilize the change in flux phase for coding binary information. Logic circuits based on SFQ pulses offer a drastically improved operating speed for logic circuits and have become known as rapid single flux quantum (RSFQ) logic circuits. As discussed in the Likharev et al. article, such RSFQ logic circuits can operate at speeds above 300 GHz; a drastic improvement over the logic circuits based on resistive state changes of superconducting devices having operating speeds of only a few gigahertz.

In general, such RSFQ logic circuits are synchronous in nature and depend on the timing of the arrival of the pulses at the inputs. As such, RSFQ logic circuits require clock inputs at the gate level. Such clock signals need to be pipelined to each gate in the circuit. Although gate level pipelining is acceptable in some applications, the need for gate level pipelining in other applications results in a relatively high overhead for clock distribution and can raise issues with respect to the latency. As such, asynchronous superconducting logic circuits have been developed. An example of such an asynchronous superconducting logic circuit is disclosed in U.S. Pat. No. 5,598,105. The asynchronous SFQ logic circuit disclosed in the '105 patent is formed from logic cells in which each logic cell includes an AND gate and an OR gate. The cell includes a pair of inputs connected to both the AND and the OR gate. Although such logic circuits are tolerant of differences in the arrival times of the voltage pulses at the inputs, the topology of the elementary logic cell requires significant real estate and increased power overhead. Thus, there is a need for an asynchronous superconducting logic circuit which can be made denser with reduced power overhead and at the same time eliminate the need to pipeline clock signals to all gates.

SUMMARY OF THE INVENTION

Briefly, the present invention relates to an asynchronous SFQ logic cell that is amenable to being used in combination logic circuits. Rather than encode each digital logic bit as one SFQ pulse, each logic bit is encoded as a series of SFQ pulses. As such, merge and join circuits can be used for elementary logic cells to form asynchronous combinational logic circuits in accordance with the present invention. Such circuits are relatively faster and denser as well as more compatible with existing synchronous SFQ logic circuits.

DESCRIPTION OF THE DRAWINGS

These and other advantages of the present invention will be readily understood with reference to the following specification and attached drawing wherein:

FIG. 1C is an equivalent circuit of the confluence buffer illustrated in FIG. 1a.

FIG. 2A is a block diagram of the merge buffer illustrated in FIG. 1A.

FIG. 2B is a simplified graphical illustration of the voltage response characteristics of the merge buffer in response to asynchronously applied input pulses.

FIG. 3A is a block diagram of a multiple flux quantum (MFQ) data encoded OR gate in accordance with the present invention.

FIG. 3B is a graphical illustration of the voltage response characteristics of the OR gate illustrated in FIG. 3A in response to MFQ encoded pulses.

FIG. 3C is a truth table for the OR gate illustrated in FIG. 3A.

FIG. 5A is a block diagram of a MFQ encoded AND gate in accordance with the present invention.

FIG. 5B is a graphical illustration of the voltage response characteristics of the MFQ encoded AND gate in response to asynchronously applied MFQ pulses.

FIG. 5C is a truth table for the AND gate illustrated in FIG. 5A.

DETAILED DESCRIPTION

The present invention relates to superconducting asynchronous combinational logic circuits formed from merge and join (also known as confluence and coincidence) buffer cells. In accordance with an important aspect of the invention, rather than encode each data bit with a single SFQ pulse, the present invention utilizes multiple flux quantum (MFQ) pulses to encode each data bit. By so encoding each data bit, the merge and join gates can be used as elementary logic cells to form superconducting asynchronous combinational logic circuits.

Figure 1A:
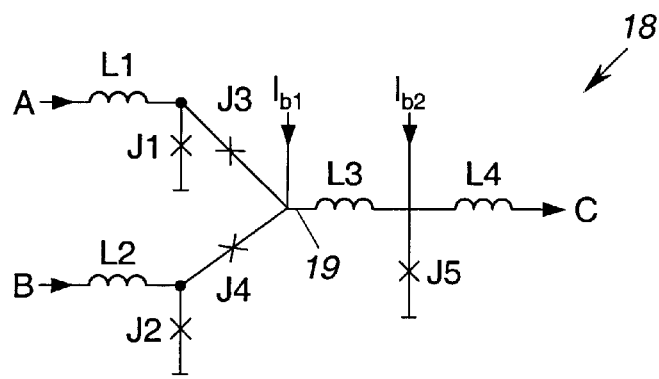
FIG. 1A is an illustration of the voltage response characteristics of the OR gate illustrated in FIG. 3A in response to MFQ encoded pulses.

In order to understand the invention, a conventional confluence or merge buffer 18, as discussed in detail in the Likarev et al. article, supra is illustrated in FIG. 1A and FIG. 2A. As shown, the merge buffer 18 includes a plurality of Josephson junctions, identified as J1–J5. Biasing currents, identified as $I_{b1}$ and $I_{b2}$, are applied to the circuit as shown. The biasing currents, $I_{b1}$ and $I_{b2}$, are selected to be less than the critical current $I_c$ for changing the state of any of the junctions. For example, $I_{b1}$ is selected to be 1.4 $I_c$ and is applied to a node 19 between the two Josephson junctions J3 and J4. The biasing current $I_{b2}$ is selected to 0.7 $I_c$. In addition, the value for L3 is selected to be 0.5 $\Phi_0/I_c$. $\Phi_0$ is the single flux quantum, equal to h/2e, where h is Planck's constant and e is the change of the electron.

Figure 1B:
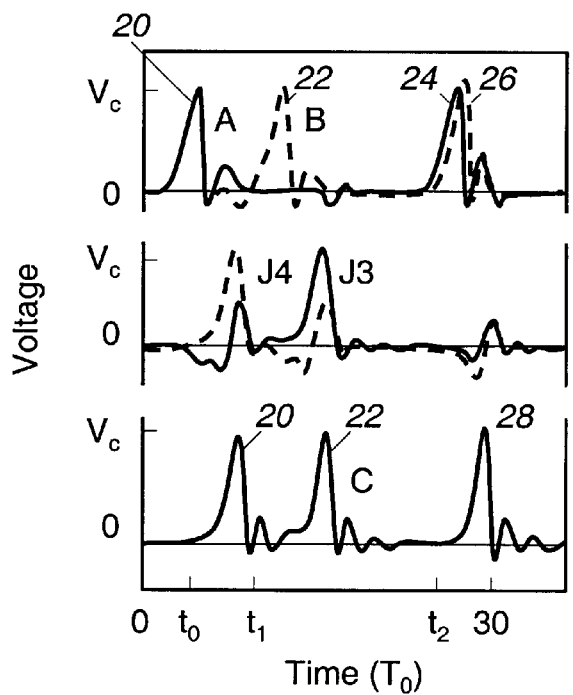
FIG. 1B is a graphical illustration illustrating the voltage response characteristics of the confluence buffer illustrated in FIG. 1A in response a pair of asynchronously applied voltage pulses to the A and B inputs.
Figure 1C:
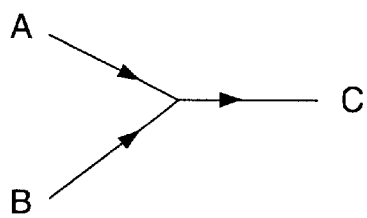

With such a configuration, a voltage pulse 20 applied to terminal A at time $t_0$ and a subsequent voltage pulse applied to terminal B at time $t_1$ propagate through the circuit to the output terminal C. More particularly, as shown in FIG. 1B, asynchronously applied pulses 20 and 22 at input terminals A and B at times $t_0$ and $t_1$ are channeled through the merge buffer 18 to the output terminals C after a small time delay. If the time delay between the input pulses applied to the terminals A and B is insufficient, as shown by the pulses 24 and 26 around time $t_2$, only a single output pulse 28 is generated at the output.

In accordance with the present invention, the characteristics of the merge buffer 18 can be used for an OR function by encoding multiple single flux quantum (SFQ) pulses as one data bit. In particular, as shown in FIG. 3B, multiple SFQ pulses, for example six (6), generally identified with the reference numeral 30, are used to encode each data bit. As such, as discussed above with reference to FIG. 1B, input signals applied to the terminals A and B of the merge buffer 18 are channeled through the device to the output. More particularly, during the time period $t_1$, multiple SFQ pulses are applied to the A input of the merge buffer 18, illustrated in FIG. 3A. If no corresponding SFQ pulses are applied to the B input during this time period, the multiple SFQ pulses will be reproduced at the output terminal of the merge buffer 18 as shown. Similarly, multiple SFQ pulses applied to the B input of the merge buffer 18 during time period $t_1$ with no pulses being applied to the A input the are reproduced at the output of the merge buffer 18 after a small time delay. Similarly, if no pulses are applied to the A or B inputs of the merge buffer 18 during the time period $t_3$, no pulses will be generated at the output. If multiple SFQ pulses are applied to the A and B input, fairly close in time as shown during a time period $t_4$, a single set of pulses will be available at the output.

With reference to FIG. 3C, if each multiple group of pulses is encoded as a single logic bit, a truth table can be developed as shown in FIG. 3C, which shows that the merge buffer 18 in which each data bit is encoded by multiple flux quantum pulse functions as an OR gate, such as the OR gate 29. As will be discussed in more detail below, this elementary logic cell can be used in combinational logic circuits in which the pulses applied to the input terminals are asynchronous to form a family of asynchronous combinational logic circuits.

Figure 4A:
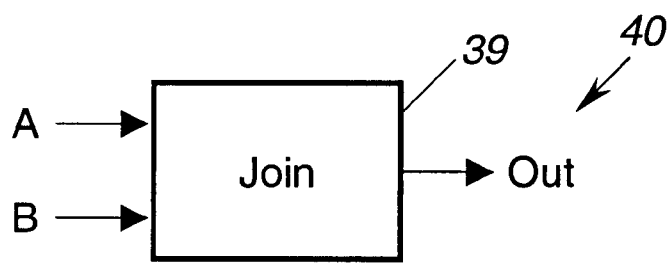
FIG. 4A is a block diagram of a join gate.
Figure 4B:
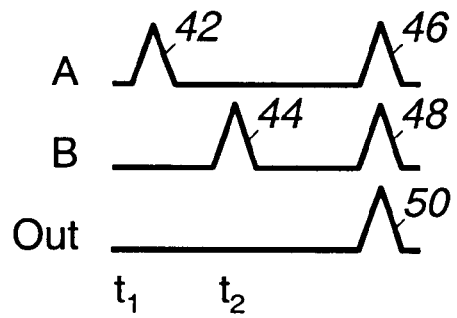
FIG. 4B is a graphical illustration of the voltage response characteristics of the join gate illustrated in FIG. 4A in response to asynchronously applied pulses.
Figure 4C:
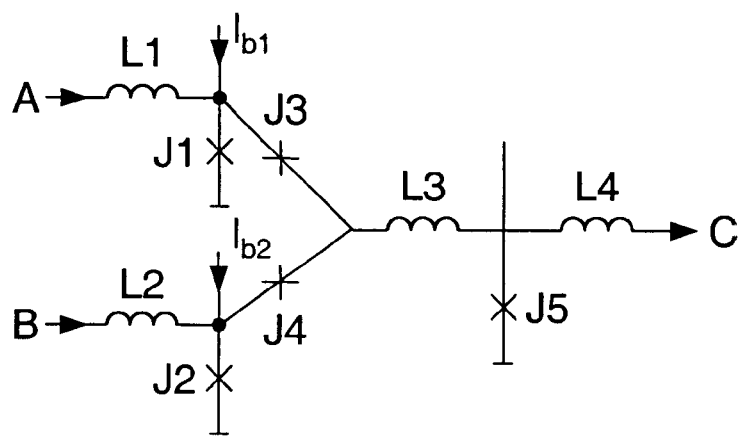
FIG. 4C is an illustration of the topology of the join circuit of FIG. 4A.

An AND logic gate can be formed from a known coincidence or join buffer circuit 39 (FIG. 4A). The topology of the join circuit is shown in FIG. 4C. For example, in order to form a join buffer, the parameter values are selected as follows. $I_{b1}=I_{b2}=0.7\ I_c$, $L_1=L_2=L_3=L_4=0.50\ \Phi_0/I_c$.

A block diagram of a known join buffer 39 is shown in FIG. 4A. As shown in FIG. 4B, SFQ pulses must be applied to the A and B inputs relatively close in time in order for the a single SFQ pulse to be generated at the output. For example, as shown in FIG. 4B, a single SFQ pulse 42 applied to the A input of the join gate 40 at time $t_1$ does not result in an output pulse at the output when no SFQ pulses are applied to the B input. Similarly, a single SFQ pulse 44 applied to the B input of the join buffer 40 at time $t_2$ with no SFQ pulse being applied at the A input also does not cause a resulting pulse to be generated at the output. Also, when no pulses are applied to either the A or B inputs, no pulses are generated at the output as shown in FIG. 5B at time $t_3$. However, when multiple SFQ pulses 46 and 48 are applied to the A and B inputs, respectively, relatively close in time, a single output pulse 50 is generated at the output of the join buffer 40.

Using the same principles as discussed above, the join buffer 39 can be used to form an AND gate, such as the AND gate 40, in accordance with the present invention by encoding multiple SFQ pulses for each data bit. For example, as shown in FIG. 5B, a group, for example six SFQ pulses, identified with the reference numeral 52, are applied to the join buffer 40 at time $t_1$. If no SFQ pulses are applied to the B input during this time period, there will be no resulting output pulses at the output terminal. Similarly, if multiple SFQ pulses 54 are applied to the B input of the join buffer 40 at a time period $t_2$, when no SFQ pulses are applied to the A input, no SFQ pulses will be available at the output. If no SFQ pulses are applied to either the A or B inputs during a time period $t_3$, no pulses will be available at the output. However, if MFQ pulses 56 and 58 are applied relatively close in time to the A and B input terminals of the join buffer 39, a single set of pulses 60 is produced at the output.

Figure 6:
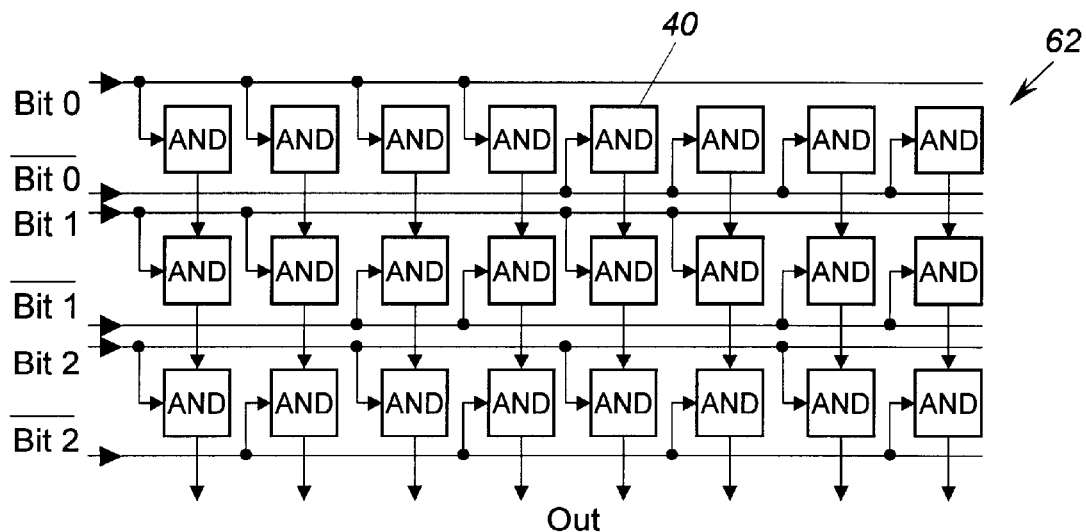
FIG. 6 is a block diagram of an address decoder incorporating a plurality of MFQ encoded AND gates in accordance with the present invention.
Figure 7:
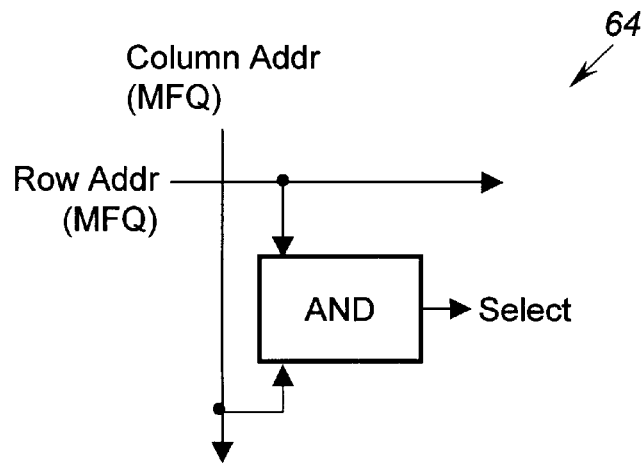
FIG. 7 is similar to FIG. 6 but for a X-Y select logic device in accordance with the present invention.

By encoding the MSFQ pulses with a single logic bit as discussed above, the join buffer 39 performs an AND gate function as indicated by the truth table illustrated in FIG. 5C. The AND gate 40 can be also be used to form asynchronous combinational logic circuits as discussed below, for example, an MFQ address decoder 62 or an X-Y logic circuit 64 as shown in FIGS. 6 and 7, respectively. Both the address decoder 62 and the X-Y select logic circuit 64 have heretofore been formed from synchronous combinational logic circuits. As shown, both the address decoder 62 and select logic circuit 64 are combinational logic circuits, formed from asynchronous logic cells, such as the AND gate 40. More particularly, the address decoder 62 is shown, for example, as a 3-bit decoder, and includes a plurality of AND gates 40. Each of the input bits 0, bit 1 and bit 2, as well as the complements, are encoded with MFQ pulses which can be asynchronously applied to the inputs as discussed above and yet provide an address decoding function heretofore possible by way of synchronous logic circuits. Decoder applications include random access memory and an X-Y addressed crossbar switch.

FIG. 7 illustrates a X-Y select logic circuit 64 formed from an AND gate 40. In this example, the row address signals are applied as MFQ pulses to one input of the AND gate 40 while the column address signals are applied to another input of the AND gate 40. The output of the AND gate 40 is used to generate a select signal to select a typical row and column address, for example for use in memory selection.

Figure 8:
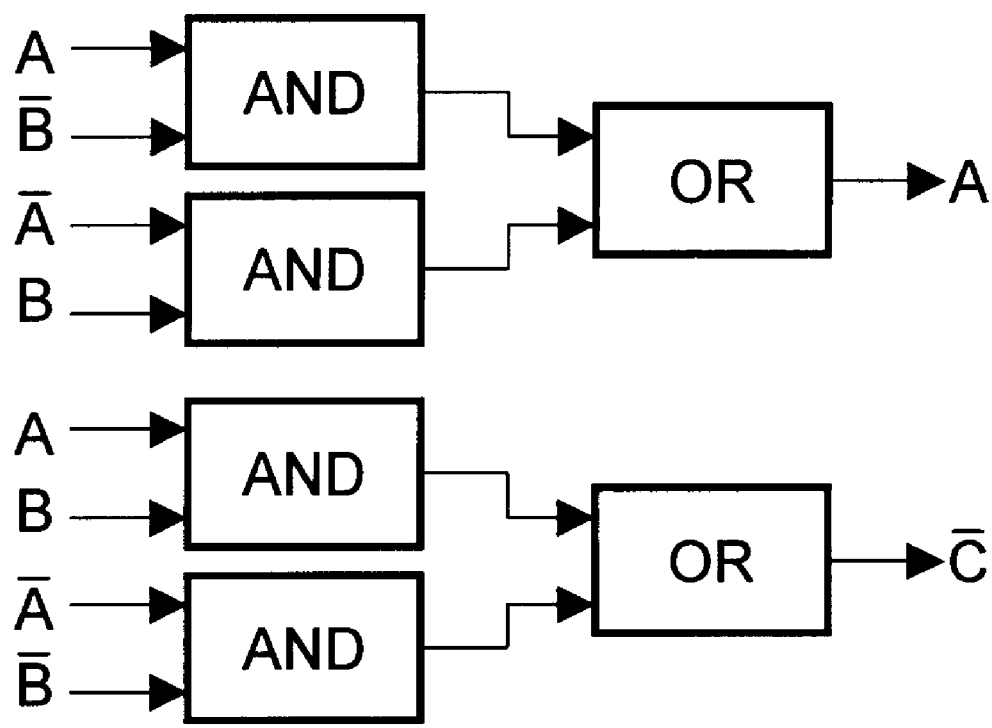
FIG. 8 is an illustration of the XOR function as a combination of AND and OR gates.

Using dual rail inputs, any combinational logic function can be synthesized using the AND and OR gates. For example, the XOR function is shown in FIG. 8.

Obviously, many modification and variations of the present invention are possible in light of the above teachings. For example, thus, it is to be understood that, within the scope of the appended claims, the invention may be practiced otherwise than as specifically described above.

What is claimed and desired to be secured by Letters Patent of the United States is:

1. A superconducting asynchronous combinational logic circuit for use in combinational logic circuits comprising:
    a logic cell formed from one or more superconducting buffers, each buffer including a plurality of Josephson junctions, each of said buffers including at least a first input and a second input and one output;
    at least a first data source and second data source, each of said first and second data sources adapted to be coupled to said first input and said second input respectively and configured to encode each data bit with a plurality of flux quantum pulses; and
    said output for providing an indication of the logic state of said logic cell based upon the status of said plurality of quantum pulses applied to each of said first input and said second inputs.

2. The superconducting asynchronous combinational logic circuit as recited in claim 1, wherein at least one of said buffers is a merge buffer and said associated predetermined logic function is an OR logic function.

3. The superconducting asynchronous combinational logic circuit as recited in claim 1, wherein at least one of said buffers is a join buffer and said associated predetermined logic function is an AND logic function.

4. The superconducting asynchronous combinational logic circuit as recited in claim 1, wherein said logic circuit includes multiple merge buffers.

5. The superconducting asynchronous combinational logic circuit as recited in claim 4, wherein said logic circuit is configured as an address decoder.

6. The superconducting asynchronous combinational logic circuit as recited in claim 5, wherein said logic circuit is configured as an X-Y select logic circuit.

7. A method for developing a logic cell for use in a superconducting asynchronous combinational logic circuits comprising the steps of:
    a) providing one or more superconducting buffers, each buffer having two or more inputs and one output; and
    b) encoding each data bit to be applied to at least two of said inputs as multiple flux quantum (MFQ) pulses.

8. The method as recited in claim 7, wherein step (a) comprises providing one or more merge buffers.

9. The method as recited in claim 7, wherein step (a) comprises providing one or more join buffers.

10. The method as recited in claim 7, further including step (c): connecting multiple buffers together forming asynchronous combinational logic circuit.

11. The method as recited in claim 10, wherein said asynchronous combinational logic circuit is an address decoder.

12. The method as recited in claim 10, wherein said asynchronous combinational logic circuit is an X-Y select logic circuit.

* * * * *